(12) United States Patent  (10) Patent No.: US 7,546,557 B2
Kong  (45) Date of Patent: Jun. 9, 2009

(54) SYSTEMS AND METHODS FOR REDUCING IR-DROP NOISE

(75) Inventor: Myung Jin Kong, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 343 days.

(21) Appl. No.: 11/516,996

(22) Filed: Sep. 7, 2006

(65) Prior Publication Data
US 2007/0001234 A1 Jan. 4, 2007

Related U.S. Application Data

(62) Division of application No. 10/932,220, filed on Sep. 1, 2004, now Pat. No. 7,137,089.

(51) Int. Cl.
G06F 17/50 (2006.01)
H01L 27/148 (2006.01)
H01L 23/58 (2006.01)

(52) U.S. Cl. .............. 716/1; 716/2; 716/5; 716/10; 257/245; 257/492; 257/493

(58) Field of Classification Search ............. 716/1–2, 716/4–5, 9–11; 257/328, 330–331, 341, 257/347, 369, 371, 374, 401, 245, 492–493; 438/127, 243, 257, 268, 270, 459
See application file for complete search history.

(56) References Cited

U.S. PATENT DOCUMENTS

| 5,510,999 | A | 4/1996 | Lee et al. ............... 364/491 |
| 6,209,122 | B1 | 3/2001 | Jyu et al. ............... 716/6 |
| 6,671,862 | B1 | 12/2003 | Seward ............... 716/5 |
| 2002/0175374 | A1* | 11/2002 | Iwata et al. ............... 257/347 |
| 2008/0028342 | A1* | 1/2008 | Tsuji et al. ............... 716/2 |

* cited by examiner

Primary Examiner—Paul Dinh
(74) Attorney, Agent, or Firm—Dergosits & Noah LLP

(57) ABSTRACT

The diffusion structures in CMOS devices can be changed to minimize the effects of IR drop on those devices. A simulation can be run before tape-off to determine which transistors are at risk. The area of the source region and/or the width of the drain region of the at-risk transistor(s) can be adjusted to change the capacitive and/or resistive capability of the transistor(s). These altered diffusion structures can reduce the peak IR drop value, such as by an amount in the range of 8%-30% of the original peak noise, to prevent the chip from malfunctioning due to the resultant noise. The reduction in IR drop can be balanced with the timing delays introduced by the increased capacitance of the source area. An optimal combination of source area and drain width can be obtained and instituted during the simulation and testing processes.

11 Claims, 4 Drawing Sheets

SYSTEMS AND METHODS FOR REDUCING IR-DROP NOISE

RELATED APPLICATION

This application is a divisional of U.S. application Ser. No. 10/932,220, filed Sep. 1, 2004 now U.S Pat. No. 7,137,089, which application is hereby incorporated by reference herein in its entirety.

TECHNICAL FIELD OF THE INVENTION

The present invention relates to transistors and microelectronic devices.

BACKGROUND

IR drop is becoming an increasingly important problem for semiconductor manufacturers as semiconductor technology, particularly CMOS technology, scales down to 0.13 µm and below. Chips can be designed that utilize tens of millions of transistors, parasitic resistors, and capacitors. Each of these transistors has to be supplied through a power grid with a proper supply voltage. Since the density of chips and systems continues to increase for Deep Submicron Designs (DSMD), the IR drop problem can lead to unreliable or malfunctioning chips, regardless of whether a DRC/LVS process (Design Rule Checking/Layout vs. Schematic process for high accuracy verification of design rules) is done successfully.

The concept of "IR drop" refers to a drop in the main supply voltage ($V_{DD}$) that can occur along the power rails between the power pads, the ground pads, and the logic components of a chip. As the geometries get smaller, so too do the supply voltages, currently pushing down to about 1V, such that the tolerance for drops in supply voltage becomes much tighter. As the IR drop to supply voltage ratio increases, the DC noise tolerance of the CMOS transistors on the chip degrades and the switching speeds acquire increased timing delays. A significant IR drop can lead to a timing violation in static logic and/or a functional failure in dynamic logic. Meeting the timing specification is critical for a successful design. Therefore, precise full-chip IR drop analysis and correction is becoming a necessary step in the full-chip design process.

Various simulation tools can be used to determine IR drop. It is not sufficient to simply determine average voltage drops, however, and it is necessary to evaluate the effects of decoupling capacitance used in the industry to fight IR drop. Due to the previous lack of reliable and accurate methods of predicting IR drop, preventative measures have primarily been used in existing systems. Such approaches involve, for example, using a more conservative design and layout approach, using additional metal layers to reduce IR drop, and/or providing additional voltage lines. Each of these approaches can increase costs and reduce performance, such that they do not provide optimal solutions to the problem of IR drop.

DETAILED DESCRIPTION

Systems and methods in accordance with embodiments of the present invention can overcome deficiencies in existing CMOS array designs by changing the diffusion structure in CMOS devices in the array that are likely to, or have the potential to, experience an IR drop during operation. The altered diffusion structures can reduce the peak IR drop value, such as by an amount in the range of 8%-30% of the original peak noise, to prevent the chip from malfunctioning due to resultant noise. Such an approach also does not require any significant area consumption, as alterations to the diffusion structure can be done in-cell.

Figure 1:
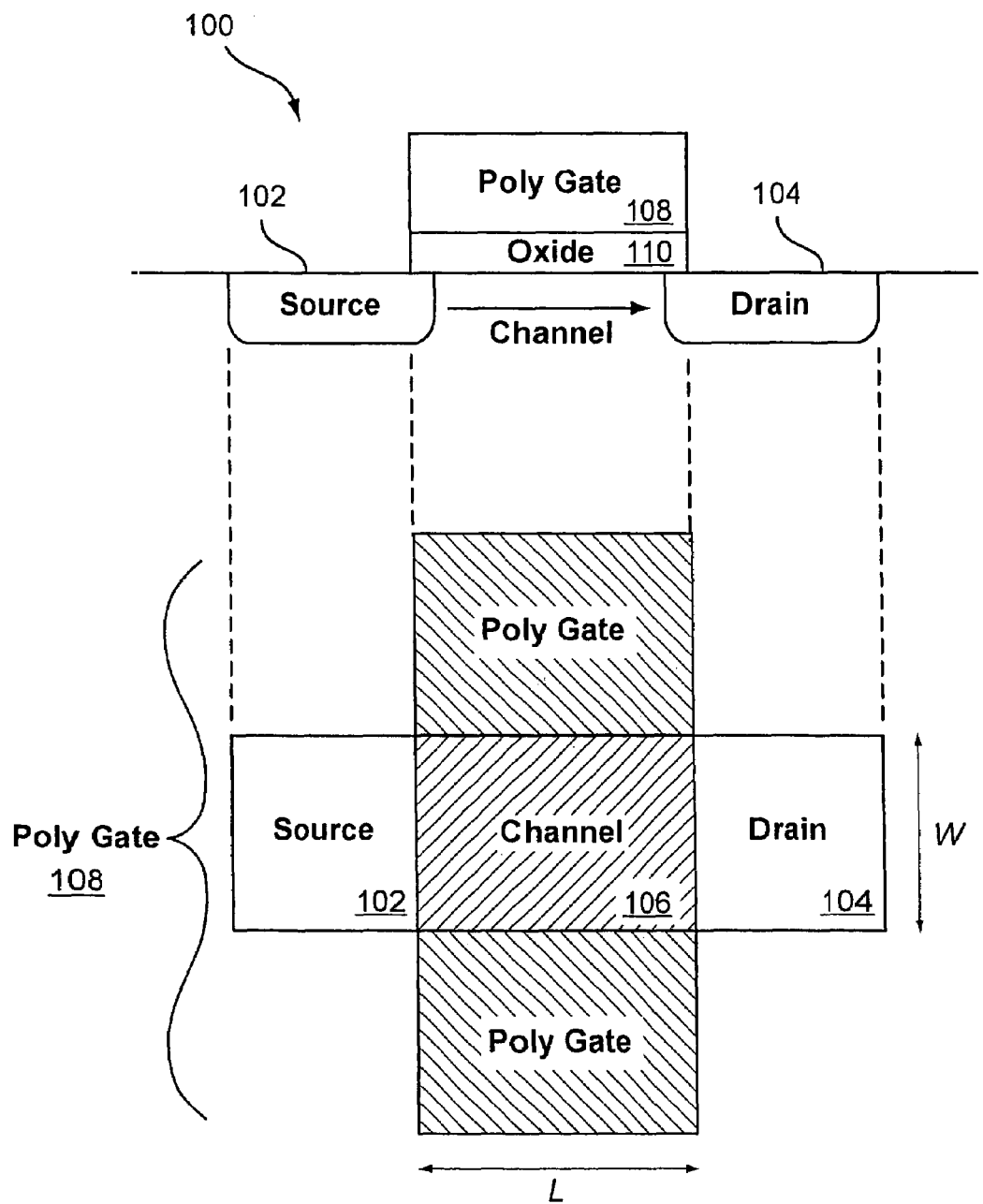
FIG. 1 is a diagram of a basic MOS device of the prior art.

MOS Field Effect Transistors (FETs) have become essential components for today's digital and microelectronic devices. As shown in the basic exemplary MOSFET 100 of FIG. 1, two diffusion regions are created in a semiconductor substrate, typically a silicon wafer or well therein, which form a source region 102 and a drain region 104. The area in the substrate between the diffusion region forms a conducting channel 106 for current flow between the source and drain regions. A gate region 108 is formed over the channel region 106, and can partially overlap the source and drain regions. The gate is formed of a conducting material, such as polysilicon, and typically is isolated from the source, channel, and drain regions by an insulating layer of an oxide material 110, typically silicon dioxide. A voltage applied between the gate structure 108 and the substrate (or well region) can induce an electric field, which can control the flow of carriers in the channel 106. In traditional transistors, the structure is symmetrical with respect to the source and the drain regions. Basic geometrical parameters for the FET device of FIG. 1 include the length L and the width W of the conducting channel 106. At present time, gate dimensions can be on the order of at least 130 nm in length and at least 180 nm in width. This corresponds to drain and source regions that can be one the order of at least 160 nm×180 nm in surface area, and a channel region that can be on the order of at least 180 nm×180 nm in surface area. The drain current of the transistor is proportional to the ratio W/L of the transistor channel. For given process parameters and voltages, a wider channel can result in a larger drain current ($I_D$) Other properties, components, designs, and operating procedures relating to MOSFET devices are well known in the art, and will not be discussed in detail herein.

As discussed above, the current flow between the source and drain regions is controlled by an electric field generated when a voltage is applied between the gate and the substrate. Each transistor has an associated threshold voltage $V_T$, which is dependent upon the design of the transistor. The threshold voltage of a MOS transistor is the amount of gate-to-source voltage ($V_{GS}$) required to turn on the transistor and allow current to flow between the source 102 and drain 104 regions. When the voltage applied to the gate 108 is smaller than this threshold voltage ($V_{GS} < V_T$), no current flows between the source and the drain. When the gate voltage is above the threshold voltage ($V_{GS} > V_T$), current can flow through the channel. In this way, the MOS transistor is either in an "off" state or an "on" state, with the transistor typically being in saturation in the on state, with the gate voltage being approximately equal to the drive voltage (neglecting IR drop), or $V_{GS} \approx V_{DD}$.

Figure 2:
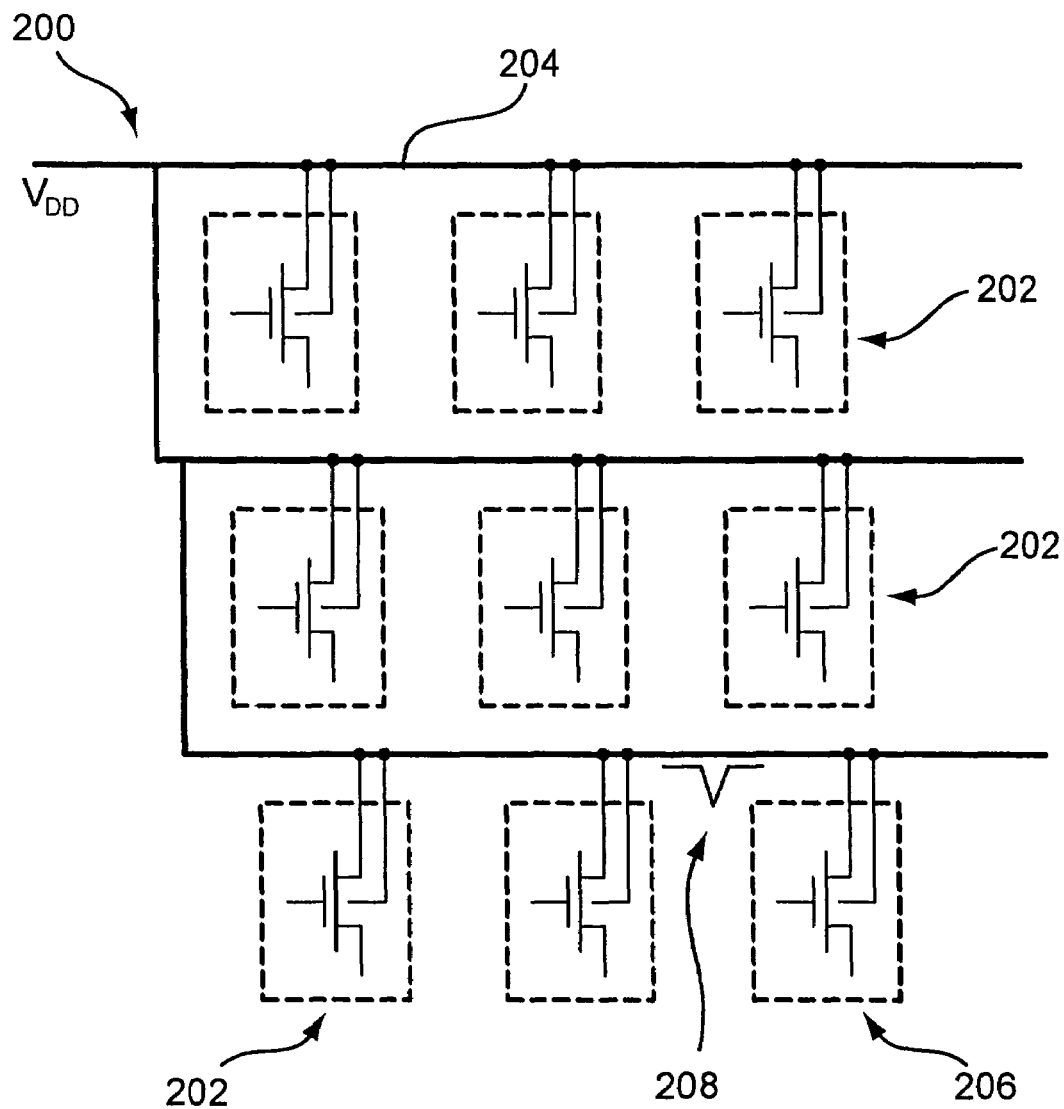
FIG. 2 is a diagram of a MOS device network of the prior art.

A grid of metal power rails 204 is used to supply the drive voltage $V_{DD}$ to each transistor 202 of a cell array 200 on a semiconductor chip, such as is shown in FIG. 2. At least one contact is made to connect a diffusion region of each transistor 202 to one of the metal lines 204. As the number of cells in a semiconductor increases, the likelihood increases that at least one of these cells will not receive a full driving voltage $V_{DD}$, particularly when a large number of those cells simultaneously utilizes that voltage. For example, if all the cells shown in FIG. 2 were to simultaneously switch "on," it is possible that one of the cells, such as the last cell 206, would see a drop 208 in drive voltage, due at least in part to the high demand placed on the voltage lines.

Simulations can be run to determine which cells are likely to receive a lower $V_{DD}$, or experience an IR-drop. There are many simulations known and used in the art for determining which cells are likely to experience IR drop. Spice-like simulators such as StarSimXT from Avanti Corporation of Fremont, Calif. and HSIM from Nassda of Santa Clara, Calif. can be used, as well as a hybrid tool available from National Semiconductor of Santa Clara, Calif. while integrates a Star-RCXT (available from Synopsis of Mountain View, Calif.)—type parasitic extraction solution, an Hspice input format compatible simulator such as StarSimXT, and Astro/Milky-Way for dynamic IR drop verification and graphical display. In one such simulation, a transistor-level dynamic IR drop analysis tool and flow can be used, which integrates existing RC extraction tools with a fast Spice-like simulator to carry out peak IR drop checks. Such an approach can utilize a two-level hierarchical RC extraction.

For cell 206 to read as "on," or to read as a "1" instead of a "0", it is necessary for the IR-drop to not cause the drive voltage to drop below the threshold voltage value. For example, assume that a full voltage level is assigned a value of 1, and a zero voltage assigned a voltage of zero. Then anything at 0.5× the maximum voltage or less can read as a zero if the voltage threshold is at 0.5. In this case, if a cell receives a voltage drop such that the cell reads 0.45 instead of 0.55, for example, the cell will read as a "0" instead of a "1". The IR drop also can cause noise that can be transferred elsewhere on the chip. There then can be a minimum drive voltage threshold, such that, for each cell to operate properly, it is necessary for that cell to receive a drive voltage that is at or above the drive voltage threshold amount. It therefore is desirable to minimize the voltage drop received by any cell of the semiconductor device to ensure that each cell receives a drive voltage that is above the minimum drive voltage threshold.

One way to accomplish this would be to place a decoupling cell or a capacitive element, between each transistor and the corresponding metal voltage line. This allows a full charge to build up in the decoupling cell before discharging to the cell. The additional delay at each cell would propagate through the chip such that the overall timing delay would provide unacceptable performance. Another approach would be to use one of these decoupling cells for only those cells determined to be at risk for IR drop. This can still provide an unacceptable solution, however, as the density requirements do not typically provide enough space to add in these additional cells, particularly at test time. As dimensions tighten, such additional space might not be available even for only a few cells.

Systems and methods in accordance with embodiments of the present invention can minimize the IR drop experienced by the cells of a device by changing the diffusion structure(s) in CMOS devices determined to be at risk for IR drop. This allows the IR drop to be addressed without increasing the footprint of the cell array on the substrate.

Figure 3A:
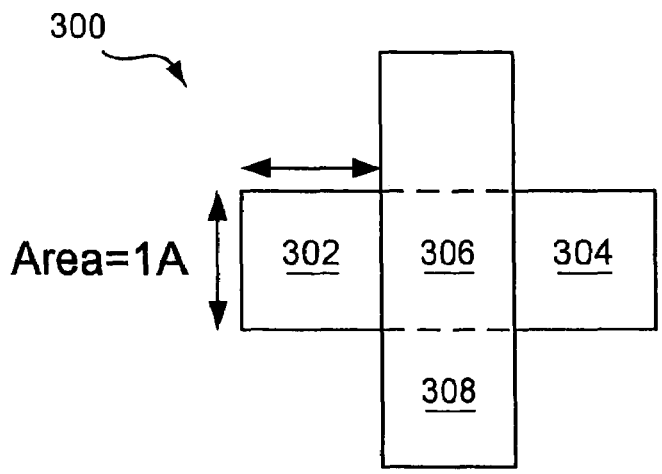
FIG. 3(a)-(c) is a diagram of MOS designs that can be used in accordance with embodiments of the present invention.
Figure 3B:
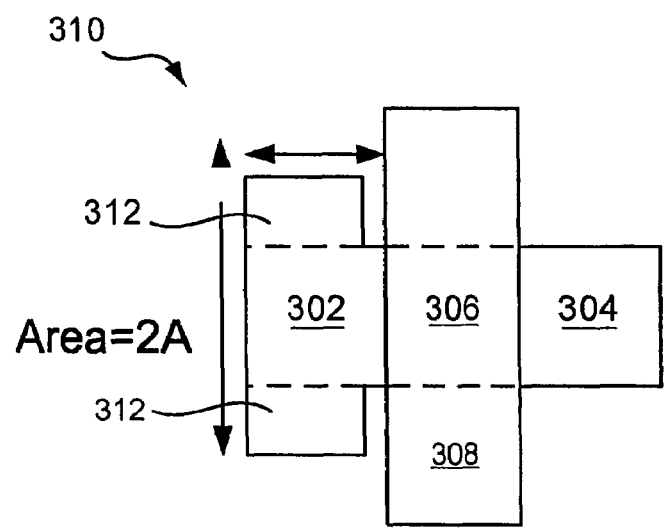

In one approach, the area A of the source region of a transistor 300 can be modified before tape-off to minimize IR drop. The area and perimeter of the source (and/or drain) can be changed without significantly altering the performance of the cell, as the length of the channel 306 is the fixed parameter that is of greatest importance. As shown in FIG. 3(a), the source region 302 initially can be substantially the same size as the drain region 304. The length of the channel region 306 under the gate electrode 308 can be fixed, while the width of the channel region can be dependent upon the width of the source and/or drain regions. The source region 302, which typically has at least one contact to a line of the main power grid, has an inherent capacitive capability. In other words, the source region 302 can act as a capacitor, in that the source region has a charge time in which energy can be stored that will be released across the semiconductor channel 306 upon application of a proper gate voltage to the gate electrode 306. In order to compensate for a drop in drive voltage received by the source region 302, it is possible to simply increase the capacitive capability of the source region in order to increase the ability of the source region 302 to receive a full charge ($V_{DD}$) before "discharging" across the channel 306. The capacitive capability can be increased in one example by simply increasing the area of the source region 302, such as by adding an additional source region(s) 312, and/or additional source area, to the initial source region 302, as shown in FIG. 3(b). In order to not increase the footprint of the cell, it can be desirable to add the additional source region(s) to adjust the width of the overall source region instead of the length. Enlarging the overall source region also allows for additional contacts to be placed on the source, which can further lessen the effects of IR drop by spreading the applied voltage over a number of contacts, each of which can have a slightly different voltage level applied.

Figure 3C:
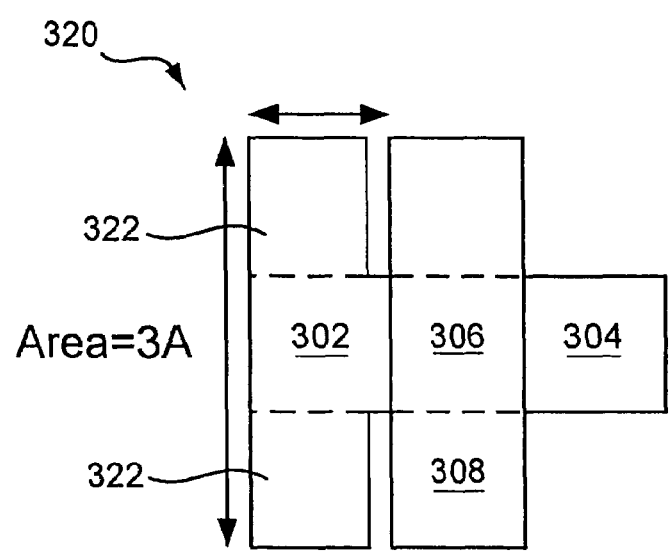

When increasing the capacitive capability of the source region, the charging and/or discharging times of the overall source region can increase as well. In order to optimize the overall source region, it can be necessary to balance the improvement in IR drop with the effect on the timing of the cell 300. It can be desirable to manage the IR drop to an acceptable level, while minimizing the charge and discharge times as much as possible in order to minimize the delays in cell switching, for example. The area of the overall source region can be adjusted up to the amount of available space on the cell, but can be at least 32400 $nm^2$ in an embodiment where the source has width and length dimensions of 180 nm×180 nm. For example, FIG. 3(b) shows the enlarged overall source region of the cell 310 after the addition of source region 312 to the initial source region 302, whereby the area of the overall source region has been increased to twice the original area (2A) for a total of 64800 $nm^2$, or about a length of 180 nm and a width of 360 nm. This increase in surface area can be done after a testing and/or simulation of the chip and the transistors thereon, but before tape-off. FIG. 3(c) shows the overall source region of the cell 320 after the area of the source region has been increased to three times the original area (3A) by adding additional source region 322.

Figure 4A:
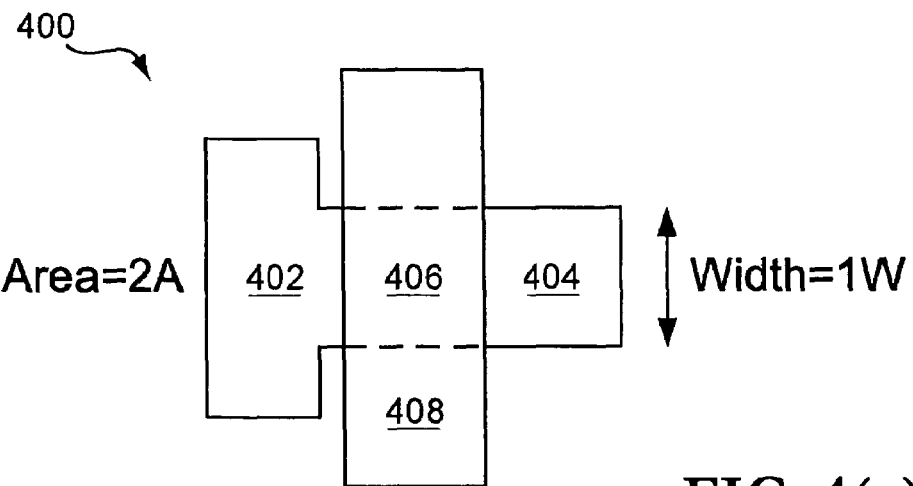
FIG. 4(a)-(c) is a diagram of additional MOS designs that can be used in accordance with embodiments of the present invention.
Figure 4B:
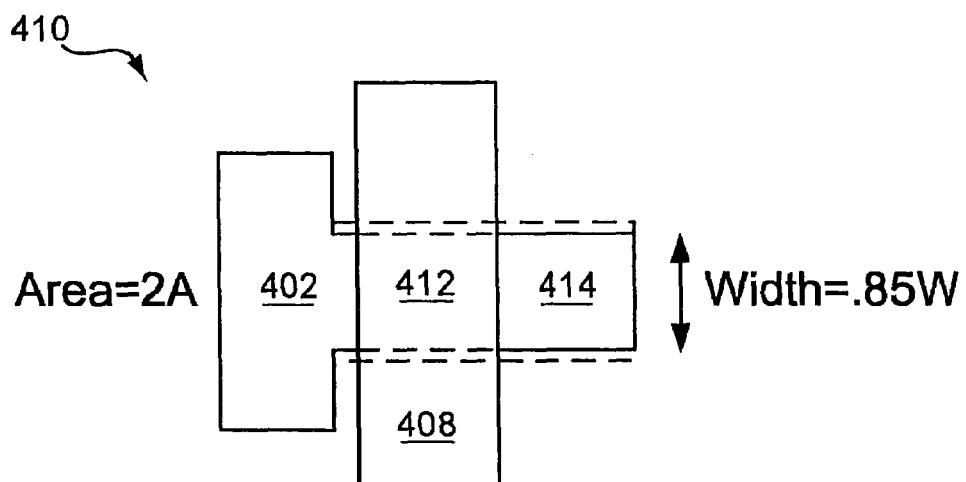
Figure 4C:
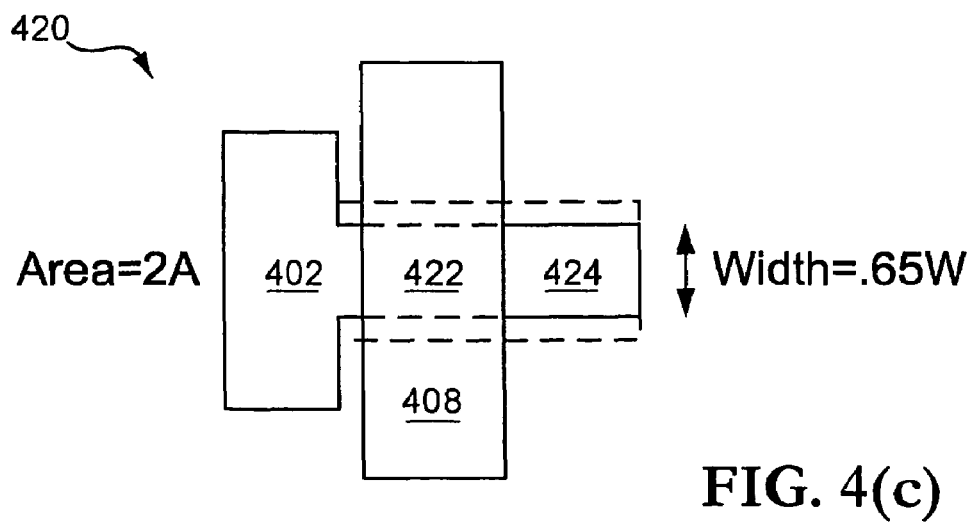

The increase in the area of the source region of a cell will result in an increased timing delay for that cell, such as an increase on the order of about 0.08 ns. The effect of this delay on the overall timing budget will be negligible. This timing delay can become significant, however, if a large number of cells each add a similar delay. By using a dynamic IR-drop fixing flow as discussed herein, a designer or manufacturer only needs to address those cells that are at risk for IR-drop, such that there is no negative impact of the accumulative delay. The delay for each cell can be improved slightly, however, by utilizing an approach in accordance with another embodiment of the present invention. The reduction in timing delay helps reduce the amount of IR-drop noise experienced by the overall chip. In this embodiment, it is possible to adjust the width of the drain region 404 (and channel region 406) in the cell 400 shown in FIG. 4(a). As stated previously, the width of the drain region 404 currently can be at least 180 nm. Changing the width of the drain region can improve the timing of current discharging from the source region 402 and flowing into the drain region 404. For example, FIG. 4(b) shows a source region 402 of a cell 410 with an increased overall area of 2A, and a width of the decreased channel 412 and drain 414 of 0.85 times the original width (0.85W), for a new drain region width of approximately 153 nm. In this embodiment the width of the channel 406 under the gate electrode 408 and the width of the drain region 404 are decreased to the same width. It should be understood, however, that other variations are possible, such as smaller channels 406 and larger drain regions 404, or larger channels and smaller drain regions. FIG. 4(b) shows a source region 402 of a cell 410 with an increased area of 2A, and a decreased channel 422 and drain 424 width of 0.65 times the original channel width (0.65W). There then are at least two variables that can be adjusted to minimize the IR drop for a given cell, namely the area of the source region and the width of the drain region.

In order to optimize the source area and drain width for a given cell, a simulation or calculation can be run to determine the effect of different source area/drain width combinations to determine the effects of those combinations on both the IR drop and the timing of the cell. A balancing can be done for each cell at risk for IR drop, wherein the amount of voltage drop can be decreased as much as possible, but only to a point where the timing delay is acceptable. Table 1 shows data for an exemplary cell using a simulation for determining IR drop locations for a semiconductor device. For this cell, it can be seen that a normal design (Area=1A, Width=1W) results in a timing delay of $2.204 \times 10^{-10}$ seconds. It might be determined that the delay cannot increase even by 15% and still be within an acceptable range. With that example, the simulation chart can be examined to see how much the IR drop can be lessened without exceeding, for instance, a 15% increase in timing delay. For this example, it can be seen that increasing the area of the source region to 3A and decreasing the width of the drain region to 0.85W results in only a 12.7% increase in timing delay, but reduces the IR drop from 10% to 9.17%. If the reduction in IR drop is enough to avoid noise problems, then this combination can be used to adjust the diffusion regions of the transistor before tape-off as described above. If, on the other hand, an IR drop of 9.66% would be acceptable, a choice might be made to use the drain region width of 0.85 W with a source area of 2A, which would have less timing delay (11.1% increase) and would require less material added to the overall source region, thereby lowering overall cost.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

TABLE 1

| Source Area | Drain Width | IR | Delay ($\times 10^{-10}$) | Delay Increase |
|---|---|---|---|---|
| 1A | 1.0 W | 0.10 | 2.204 | — |
| 1A | 0.85 W | 0.09859 | 2.4043 | 9.1% |
| 1A | 0.7 W | 0.087 | 2.6999 | 22.5% |
| 1A | 0.65 W | 0.0832 | 2.8346 | 28.6% |
| 2A | 1.0 W | 0.10692 | 2.2442 | 1.8% |
| 2A | 0.85 W | 0.09663 | 2.44867 | 11.1% |
| 2A | 0.7 W | 0.08578 | 2.7529 | 24.9% |

TABLE 1-continued

| Source Area | Drain Width | IR | Delay ($\times 10^{-10}$) | Delay Increase |
|---|---|---|---|---|
| 2A | 0.65 W | 0.08144 | 2.8948 | 31.3% |
| 3A | 1.0 W | 0.1051 | 2.2792 | 3.4% |
| 3A | 0.85 W | 0.0917 | 2.4829 | 12.7% |

What is claimed is:

1. A CMOS transistor, comprising:
a semiconductor substrate having a spaced apart first source region and drain region each having a first conductivity type, formed in a semiconductor substrate having a second conductivity type opposite the first conductivity type, to define a channel region therebetween;
a first source region area formed at a first end of the channel region and a drain region formed at a second end of the channel region, the first source region capable of receiving a drive voltage and having a width similar to a width of the drain region;
a gate electrode overlying the channel region, the gate electrode capable of receiving a control voltage to induce an electric field across the channel; and
an additional source region area formed adjacent the first source region area, the first and second source region areas forming an enlarged overall source region area providing increased capacitance over the first source region area, whereby when the electric field is induced across the channel the energy stored by the enlarged overall source region area and released across the channel region is above a minimum threshold.

2. The transistor according to claim 1, further comprising:
an insulating layer positioned between the gate electrode and the channel, source, and drain regions.

3. The transistor according to claim 1, further comprising:
a voltage line supplying the drive voltage to the first and second source regions.

4. The transistor according to claim 1, wherein:
the enlarged overall source region area has a surface area that is greater than a surface area of the first source region area.

5. The transistor according to claim 1, wherein:
the enlarged source region area has a surface area that is at least twice as large as a surface area of the first source region area.

6. The transistor according to claim 1, further comprising:
a reduced drain region area formed from the drain region of the semiconductor substrate, the reduced drain region area being less wide than the drain region in order to decrease a timing delay of the transistor.

7. The transistor according to claim 6, wherein: the reduced drain region area is at least 15% less wide than the drain region.

8. The transistor according to claim 7, wherein: the reduced drain region area has the same length as the drain region.

9. The transistor according to claim 1, wherein: the first source region area has a width of at least 180 nm and a length of at least 160 nm.

10. The transistor according to claim 1, wherein:
the drain region has a width of at least 180 nm and a length of at least 160 nm.

11. The transistor according to claim 6, further comprising:
a reduced channel region area having a width substantially equal to the width of the reduced drain region area.

* * * * *